(12) United States Patent
Chen

(10) Patent No.: US 7,227,197 B2
(45) Date of Patent: Jun. 5, 2007

(54) SEMICONDUCTOR HIGH-VOLTAGE DEVICES

(75) Inventor: Xingbi Chen, Chengdu (CN)

(73) Assignee: Third Dimension (3D) Semiconductor, Inc., Tempe, AZ (US)

( * ) Notice: Subject to any disclaimer, the term of this patent is extended or adjusted under 35 U.S.C. 154(b) by 0 days.

(21) Appl. No.: 10/860,435

(22) Filed: Jun. 3, 2004

(65) Prior Publication Data

US 2005/0035406 A1 Feb. 17, 2005

Related U.S. Application Data

(60) Division of application No. 10/382,027, filed on Mar. 5, 2003, now Pat. No. 6,936,867, which is a division of application No. 08/953,077, filed on Oct. 17, 1997, now Pat. No. 6,635,906, which is a continuation of application No. 08/598,386, filed on Feb. 8, 1996, now abandoned, which is a continuation of application No. 08/263,339, filed on Jun. 21, 1994, now Pat. No. 5,563,350.

(30) Foreign Application Priority Data

Oct. 29, 1993 (CN) .............................. 93 1 15356

(51) Int. Cl.
 *H01L 29/74* (2006.01)
 *H01L 29/76* (2006.01)
(52) U.S. Cl. ...................... 257/146; 257/142; 257/147; 257/329
(58) Field of Classification Search ................ 257/119, 257/121, 129, 132, 138, 139, 168, 146–149, 257/329, 335, 341, 401, 551, 603–606
See application file for complete search history.

(56) References Cited

U.S. PATENT DOCUMENTS 3,404,295 A    10/1968  Warner, Jr.

(Continued)

FOREIGN PATENT DOCUMENTS

JP      5238889         3/1977

(Continued)

OTHER PUBLICATIONS

Chenming Hu, Optimum Doping Profile for Minimum Ohmic Resistance and High-Breakdown Voltage, IEEE Transactions on Electron Devices, vol. ED 26, No. 3 pp. 243-244, Mar. 1979.

(Continued)

*Primary Examiner*—Ori Nadav
(74) *Attorney, Agent, or Firm*—Akin Gump Strauss Hauer & Feld LLP

(57) ABSTRACT

A semiconductor high-voltage device comprising a voltage sustaining layer between a n+-region and a p+-region is provided, which is a uniformly doped n(or p)-layer containing a plurality of floating p (or n)-islands. The effect of the floating islands is to absorb a large part of the electric flux when the layer is fully depleted under high reverse bias voltage so as to the peak field is not increased when the doping concentration of voltage sustaining layer is increased. Therefore, the thickness and the specific on-resistance of the voltage sustaining layer for a given breakdown voltage can be much lower than those of a conventional voltage sustaining layer with the same breakdown voltage. By using the voltage sustaining layer of this invention, various high voltage devices can be made with better relation between specific on-resistance and breakdown voltage.

7 Claims, 5 Drawing Sheets

U.S. PATENT DOCUMENTS

| | | |
|---|---|---|
| 3,497,777 A | 2/1970 | Teszner |
| 3,564,356 A | 2/1971 | Wilson |
| 4,754,310 A | 6/1988 | Coe |
| 4,775,881 A | 10/1988 | Ploog et al. |
| 4,821,095 A | 4/1989 | Temple |
| 4,868,624 A * | 9/1989 | Grung et al. ............... 257/273 |
| 5,027,180 A | 6/1991 | Nishizawa et al. |
| 5,105,243 A | 4/1992 | Nakagawa et al. |
| 5,216,275 A | 6/1993 | Chen |
| 5,218,226 A * | 6/1993 | Slatter et al. ............... 257/546 |
| 5,219,777 A | 6/1993 | Kang |
| 5,389,815 A | 2/1995 | Takahashi |
| 5,418,376 A | 5/1995 | Muraoka et al. |
| 5,430,311 A | 7/1995 | Murakami et al. |
| 5,438,215 A | 8/1995 | Tihanyi |
| 5,519,245 A | 5/1996 | Tokura et al. |
| 5,572,048 A | 11/1996 | Sugawara |
| 6,011,298 A | 1/2000 | Blanchard |
| 6,066,878 A | 5/2000 | Neilson |

OTHER PUBLICATIONS

Victor A. K. Temple, et al., A 600-Volt MOSFET Designed for Low On-Resistance, IEEE Transactions on Electron Devices, vol. ED 27, No. 2, pp. 343-349, Feb. 1980.

Xing-Bi Chen, et al., Optimum Doping Profile of Power MOSFET Epitaxial Layer, IEEE Transactions on Electron Devices, vol. ED 29, No. 6 pp. 985-987, Jun. 1982.

Rossel, Power M.O.S. Devices, Microelectron, Reliab. vol. 24, No. 2 pp. 339-366, 1984.

* cited by examiner

FIG. 3A  FIG. 3B

SEMICONDUCTOR HIGH-VOLTAGE DEVICES

This application is a divisional of patent application Ser. No. 10/382,027, filed Mar. 5, 2003 now U.S. Pat. No. 6,936,867 which is a divisional of 08/953,077, filed Oct. 17, 1997, now U.S. Pat. No. 6,635,906, which is a continuation of 08/598,386, filed Feb. 8, 1996, now abandoned, which is a continuation of 08/263,339, filed Jun. 21 1994, now U.S. Pat. No. 5,563,350.

FIELD OF INVENTION

This invention relates to semiconductor high voltage devices, and specifically to semiconductor high voltage devices with voltage sustaining layer containing floating regions.

BACKGROUND OF THE INVENTION

It is well-known that in many semiconductor devices, such as VD-MOST and SIT, a high sustaining voltage always accompanies a high specific on-resistance. This is due to the fact that, for a high sustaining voltage, thickness of a voltage sustaining layer should be large and doping concentration of the voltage sustaining layer should be low, so as the peak field does not exceed the critical field for breakdown $-E_C$, which is normally expressed by $E^C = 8.2 \times 10^5 \times V_B^{-0.2}$ V/cm for silicon, where $V_B$ is the breakdown voltage of the voltage sustaining layer.

In a uniformly doped n-type voltage sustaining layer between p+-region and n+-region, in order to obtain a minimum specific on-resistance at a given breakdown voltage, a doping concentration $N_D$ and a thickness W of the voltage sustaining layer are optimized such that a maximum field is at p+-n-junction and its value is equal to $E_C$, a minimum field is at n+-n-junction and equal to $E_C/3$. For silicon device, $$N_D = 1.9 \times 10^{18} \times V_B^{-1.4} \text{ cm}^{-3} \quad (1)$$

$$W = 1.8 \times 10^{-2} \times V_B^{1.2} \text{ µm}^{-2} \quad (2)$$

(see, e.g., P. Rossel, Microelectron. Reliab., vol. 24, No. 2, pp 339-336, 1984).

In a VDMOST shown in FIG. 1A, a field profile in the voltage sustaining layer at $V_B$ is shown in FIG. 1B, where a slope of the field versus distance is $_qN_D/E_s$, $E_s$ is the permittivity of the semiconductor and q is the electron charge. The change of field through the n-region is $_qN_D/E_s$, $2E_C/3$. The relation between $R_{on}$ and $V_B$ of a n-type voltage sustaining layer is then expressed by $$R_{on} = W/q\mu_n N_D = 0.83 \times 10^{-8} \times V_B^{2.5} \Omega\cdot\text{cm}^2 \quad (3)$$

where $\mu_n$ is the mobility of the electron and $\mu_n = 710 \times V_B^{0.1}$ cm/V.sec is used for silicon.

In order to get even lower $R_{on}$ at a given $V_B$, some research have been done to optimize the doping profile instead of using a uniform doping, see: [1] C. Hu, IEEE Trans. Electron Devices, vol. ED-2, No. 3, p243 (1979); [2] V. A. K. Temple et al., IEEE Trans. Electron Devices, vol. ED-27, No. 2, p243 91980); [3] X. B. Chen, C. Hu, IEEE Trans. Electron Devices, vol. ED-27, No. 6, p985-987 (1982). However, the results show no significant improvement.

SUMMARY OF THE INVENTION

The purpose of this invention is to provide a semiconductor high voltage device having a new voltage sustaining layer with better relationship between $R_{on}$ and $V_B$. To achieve the above purpose, a semiconductor high voltage devices is provided, which comprises a substrate of a first conductivity type, at least one region of a second conductivity type, and a voltage sustaining layer of the first conductivity type having plurality of discrete floating (embedded) islands of a second conductivity between said substrate and said region of second conductivity type.

According to this invention, an n (or p) type voltage sustaining layer is divided by (n−1) planes into n sub-layers with equal thickness, p (or n) type discrete floating islands are introduced with their geometrical centers on such planes. The average dose $N_T$ of the floating islands in each plane is about $2e_s E_c/3q$. For silicon, $$N_T = 2E_s E_c/3q = 3.53 \cdot 10^{12} V_B^{-0.2} \text{ cm}^{-2} \quad (4)$$

With such a floating island, the field is reduced by an amount about $2E_C/3$ from a maximum value $E_C$ at a side of the floating island to a minimum value $E_C/3$ at another side of the floating island so far as the floating island is fully depleted. Each sub-layer is designed to sustain a voltage of $V_{B1} = V_B/n$, and to have a thickness and doping concentration which are almost the same as those form formulas (1) and (2) with $V_B$ is replaced by $V_{B1}$, so that when a reverse voltage which is about the breakdown voltage $V_B$ is applied over the whole voltage sustaining layer, the maximum field is $E_C$ and the minimum field is $E_C/3$, where the locations of the maximum field are not only at the p+-n (or n+-p) junction, but also at the points of each p (or n) island nearest to the n+-n (or p+-p) junction; the locations of the minimum field are not only at the n+-n (or p+-p) junction, but also at the points of each p (or n) islands nearest to the p+-n (or n+-p) junction. An example of the structure of a VDMOST using a voltage sustaining layer of this invention with n=2 is shown in FIG. 3A and the field profile under a reverse voltage of $V_B$ is shown in FIG. 3B. Apparently, in such a condition, $V_B = 2WE_C/3$, where W is the total thickness of the voltage sustaining layer.

It is easy to prove that the above structured voltage sustaining layer including a plurality of floating regions if full depleted under a reverse bias voltage about $V_B/2$. The flux due to the charges of the ionized donors (or acceptors) under the p (or n) islands are almost totally terminated by the charges of the p (or n) islands. The maximum field is then $2E_C/3$ and the minimum field is zero, the locations of the maximum field are the same as those under a reverse bias voltage of $V_B$.

Apparently, the p (or n) islands make the field not to be accumulated throughout the whole voltage sustaining layer. For a given value of breakdown voltage $V_B$, the doping concentration $N_D$ can be higher than that in a conventional voltage sustaining layer and the specific on-resistance is much lower than that in a conventional voltage sustaining layer.

Suppose that there are n sub-layers in a voltage sustaining layer. Then, each sub-layer can sustain a voltage of $V_{B/n}$, where $V_B$ is the breakdown voltage of the total voltage sustaining layer. Obviously, instead of (3), the relation of $R_{on}$ and $V_B$ of this invention is $$R_{on} = n \times 0.83 \times 10^{-8} (V_B/n)^{2.5} \, \Omega.\text{cm}^2 \quad (5)$$

$$= 0.83 \times 10^{-8} V_B^{2.5} / n^{1.5} \, \Omega.\text{cm}^2$$

Compared to formula (3), it can been seen that the on-resistance of a voltage sustaining layer having n sub-layers is much lower than that of a conventional one.

The inventor has experimented and obtained remarkable results, which show that the on-resistance of a semiconductor device using a voltage sustaining layer with n=2 of this invention is at least lower than ½ of that of a conventional one with the same breakdown voltage, although the real value of $R_{on}$ of a voltage sustaining layer having floating islands is a little higher than the value calculated from expression (5) when n<3, due to the effect that the current path is narrowed by the p-type floating islands. Besides, for minimizing $R_{on}$, the optimum value of $N_T$ is slightly different with the expression (4), due to that the negative charges of p-type floating islands are concentrated in the p-regions instead of being uniformly distributed on a plane, whereas these negative charges are used to absorb the flux of ionized donors below that plane.

BRIEF DESCRIPTION OF THE DRAWINGS

FIG. 2 shows a voltage sustaining layer structure of this invention, where

FIG. 3 shows the structure and the field profile of a VDMOST with the voltage sustaining layer of this invention. In FIG. 3A, the voltage sustaining layer of FIG. 2A is used. The field profile of this structure under a reverse voltage of $V_B$ is shown in FIG. 3B.

FIG. 4 shows the structure of an IGBT with a voltage sustaining layer of this invention.

All the structures schematically shown in the figures are cross-sectional view. In FIGS. 3-7, the same numeral designates similar part of a high voltage semiconductor device, where, 1 designates p (or n) island in the voltage sustaining layer; 3 designates n+ (or p+) substrate; 4 designates p (or n) source body; 5 designates n+ (or p+) source; 6 designates p+(or n+) substrate; 7 designates n (or p) buffer layer; 8 designates p+ (or n+) outer base of BJT; 9 designates p+ (or n+) grid of SIT; and shaded regions designate oxide regions.

DESCRIPTION OF THE PREFERRED EMBODIMENTS

FIG. 2 shows several structures of a voltage sustaining layer according to the invention.

Figures 1, 1A, 1B:
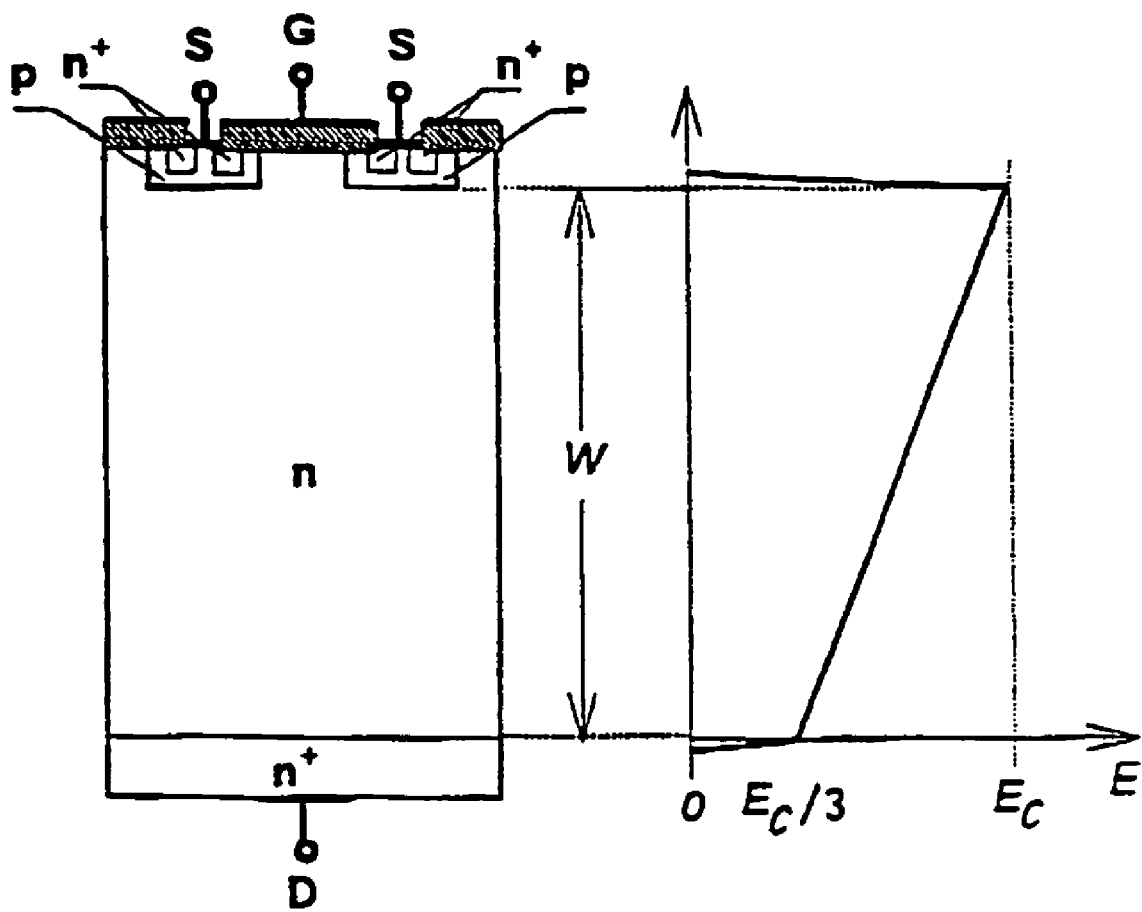
FIG. 1 is the schematic diagram of the VDMOST of prior art, where
FIG. 1A shows the structure and FIG. 1B shows the field profile.
Figure 2A:
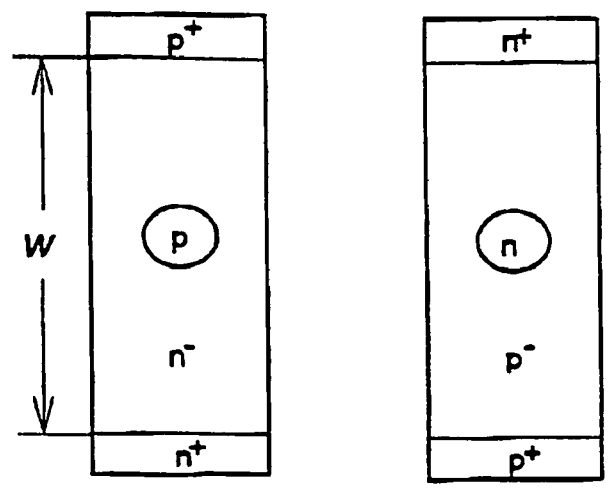
FIG. 2A shows a voltage sustaining layer structure with islands in one plane.
Figure 2B:
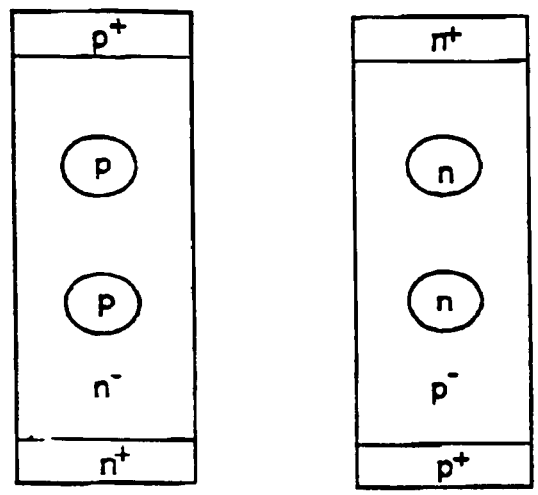
FIGS. 2B and 2C show the structures of the voltage sustaining layer with the floating islands in two planes.
Figure 2C:
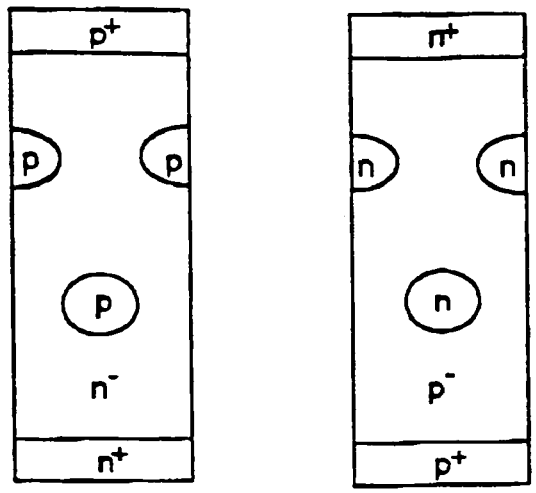

In FIG. 2A, a voltage sustaining layer with p (or n) islands in a plane is shown (i.e., n=2, two sub-layers). In FIG. 2B, a voltage sustaining layer with p (or n) islands disposed in two planes is shown (i.e., n=3, three sub-layers), where each island in the upper plane is vertically arranged over a corresponding island in the lower plane. FIG. 2C shows another voltage sustaining layer with two planes of p (or n) islands (n=3), wherein each of islands in the upper plane is vertically arranged in the middle of two neighboring islands in the lower plane.

The horizontal layout of the voltage sustaining layer can be either interdigitated (finger), or hexagonal (cell), or rectangular (cell). In all the figures of schematic cross-sectional view of the structures, only one or two units (fingers or cells) of the voltage sustaining layer are shown.

The voltage sustaining layer of this invention can be used in many high voltage devices.

1) High Voltage Diode

This can be simply realized by forming two electrodes on the p+-region and the n+-region in any of structures shown in FIG. 2.

2) High Voltage (or Power) VDMOST

Figure 3C:
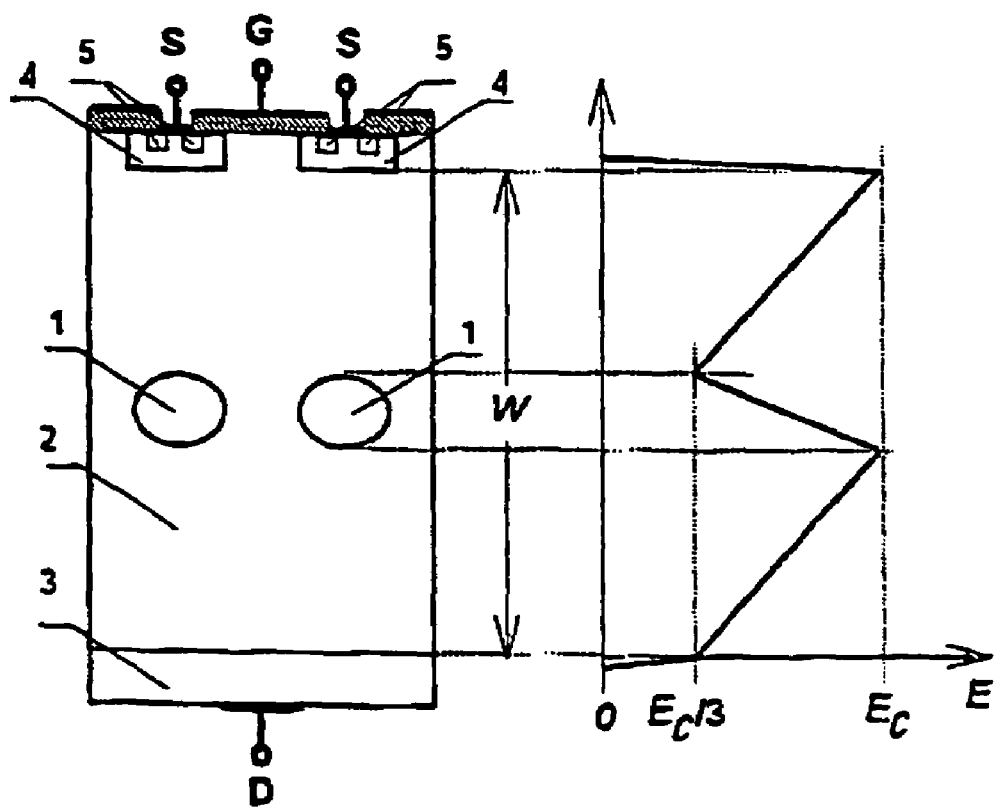
In FIG. 3C, a voltage sustaining layer of FIG. 2C is used.
Figure 3C:
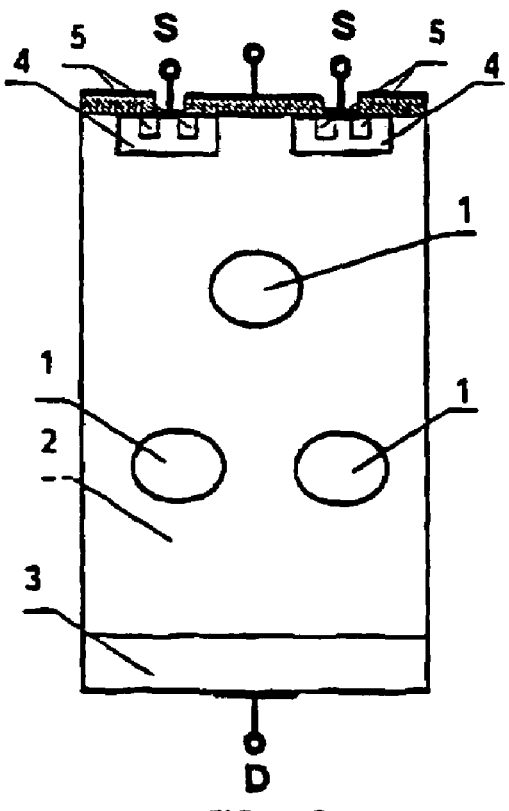

FIG. 3A shows a structure of a vertical diffusion metal oxide semiconductor transistor (VDMOS or VDMOST) using the voltage sustaining layer with a plurality of floating islands disposed in one plane, i.e., n=2. FIG. 3B shows the field profile along a line through a center of one of the islands in the voltage sustaining layer and perpendicular to said planes in FIG. 3A. FIG. 3C shows a structure of a VDMOST using a voltage sustaining layer with islands in two planes, i.e., n=3.

The turn-off process of a resultant device is almost as fast as a conventional VDMOST. The turn-on process is like the turn-off process of a conventional IGBT, which consists of a fast stage and a long tail. The long tail is due to the p (or n) island needing to be charged.

3) High Voltage (or Power) IGBT

Figures 4A, 4B:
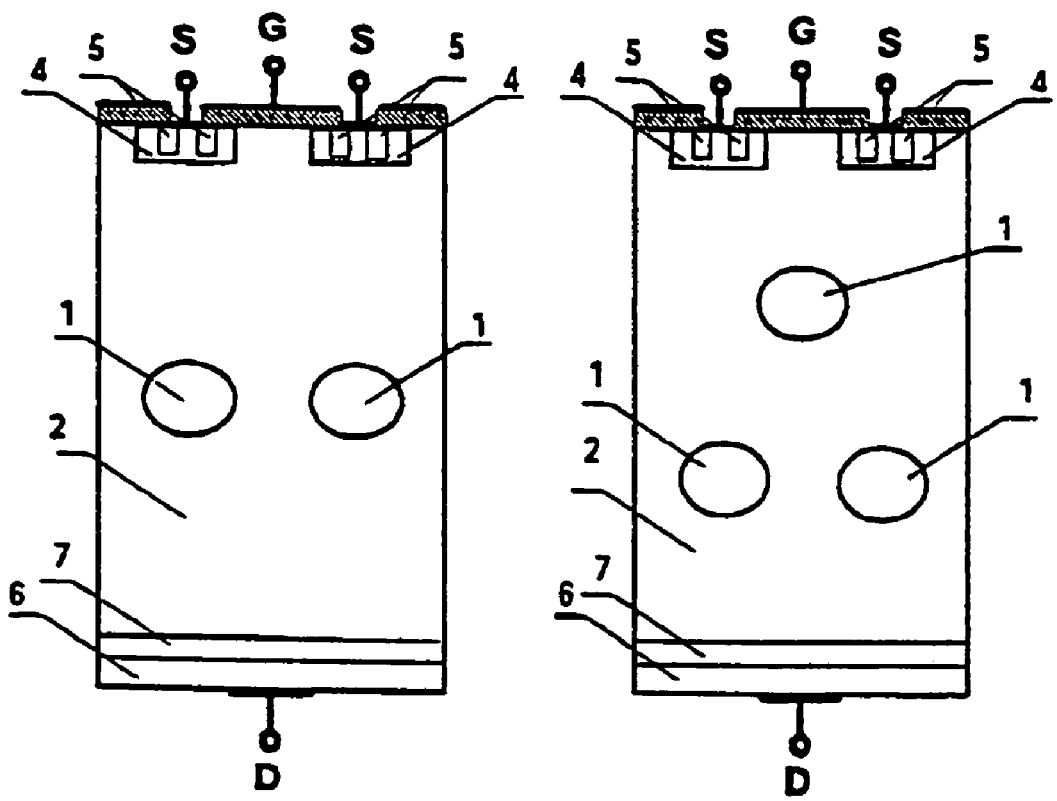
In FIG. 4A, a voltage sustaining layer of FIG. 2A is used.
In FIG. 4B, a voltage sustaining layer of FIG. 2C is used.

FIG. 4A shows a structure of an IGBT using a voltage sustaining layer with n=2. FIG. 4B shows a structure of an IGBT using a voltage sustaining layer with n=3. In order to improve the turn-on process of a VDMOST with the voltage sustaining layer of this invention, only a few amount of minorities is needed to charge the islands in the voltage sustaining layer. This can be done by using a IGBT structure with a very low injection by the inventor that an injection ratio of less than 0.1 is enough to make the turn-on process to be almost as fast as the turn-off process and results no long tail. The low injection ratio makes the device operate dominantly by the majority carriers.

4) High Voltage (or Power) RMOST

Figure 5:
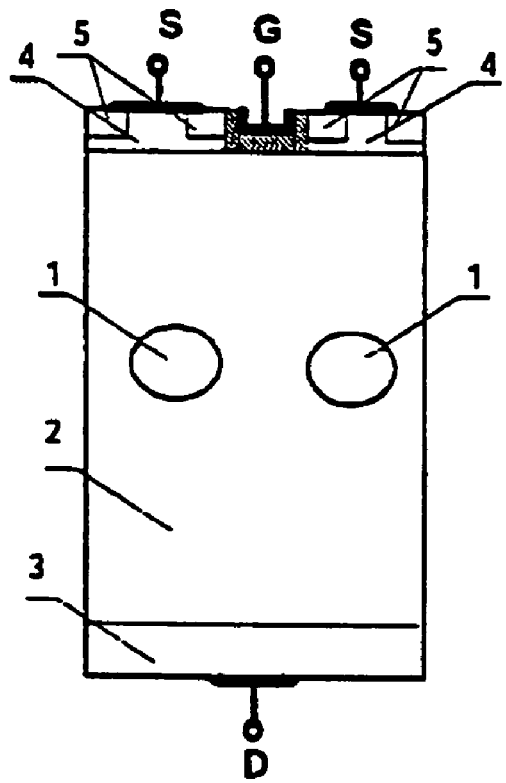
FIG. 5 shows a structure of a RMOST with the voltage sustaining layer of this invention shown in FIG. 2A.

FIG. 5 shows a structure of an RMOST using a voltage sustaining layer of this invention, where n=2.

5) High Voltage (or Power) BJT

Figure 6:
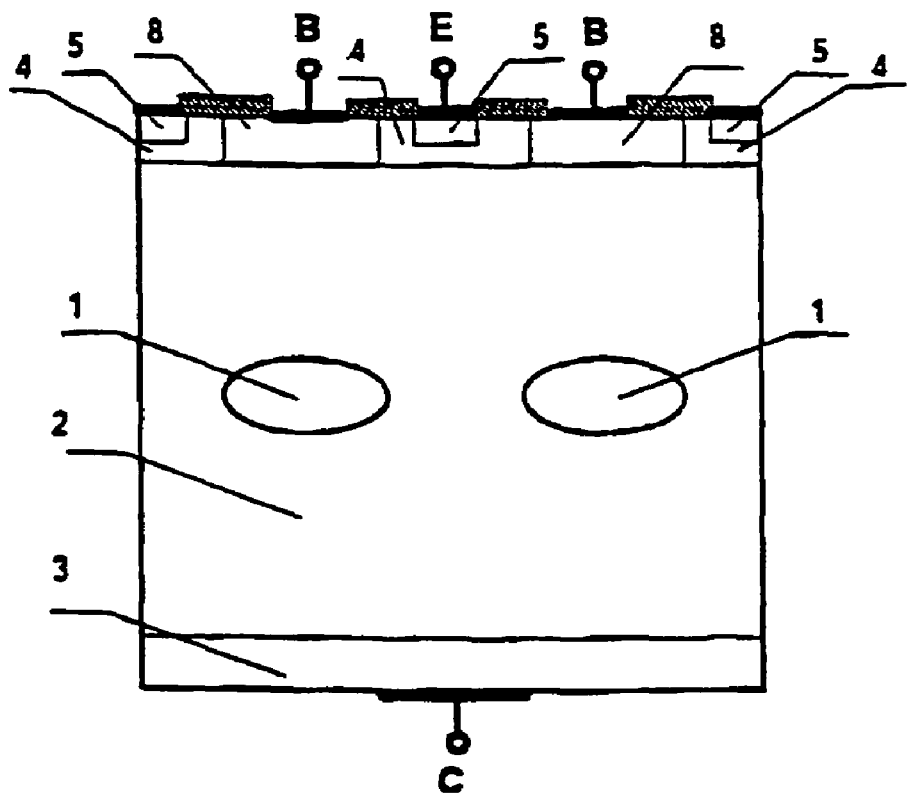
FIG. 6 shows a structure of a bipolar junction transistor with the voltage sustaining layer of this invention shown in FIG. 2A.

FIG. 6 shows a structure of a bipolar junction transistor using a voltage sustaining layer of this invention, where n=2.

6) High Voltage (or Power)SIT

Figure 7:
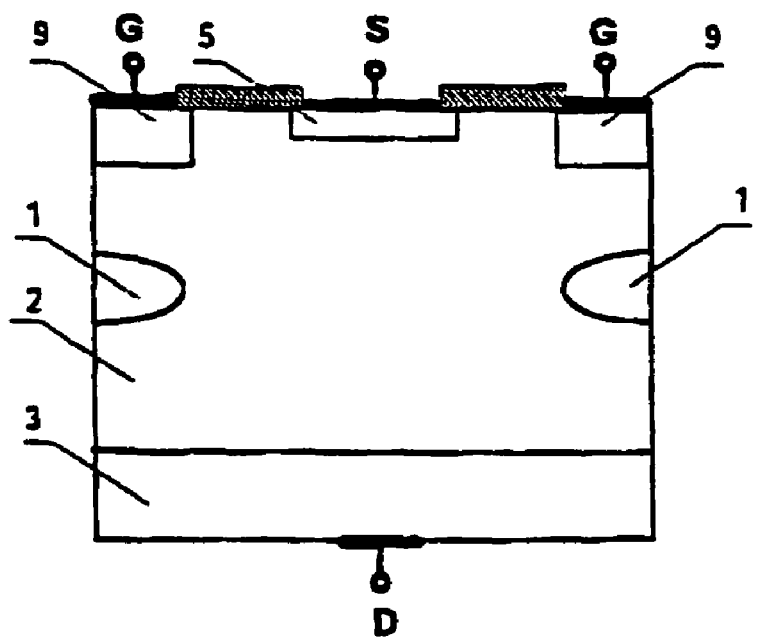
FIG. 7 shows a structure of a SIT with the voltage sustaining layer of this invention shown in FIG. 2A.

FIG. 7 shows a structure of a static induction transistor using a voltage sustaining layer of this invention, where n=2.

The design references of a voltage sustaining layer of this invention may be calculated according to above formulas for calculating $E_c$ and the average dose of the islands in a plane.

For example, at first, a value of a desirable breakdown voltage $V_B$ is determined, and the value of $E_C$ is calculated from the determined $E_C$. Then, from the technology achievable number of sub-layers n, the lateral size of a unit and the width of the islands in a plane, the number of impurity atoms in each island is calculated. The calculated values can be used as the reference values for simulation in CAD as more accurate values are needed.

An example of process for making a vertical n-IGBT using the voltage sustaining layer of this invention is stated briefly as follows:

First step: preparing a wafer of a p+-substrate having an n+-buffer on it.

Second step: forming a n-epilayer on said wafer;

Third step: growing a thin oxide layer on the epilayer and forming openings by photo-lithograph;

Fourth step: implanting boron through the openings for making p-islands and then removing the oxide layer;

Fifth step: repeat (n−1) times of second step to fourth step.

The following steps are all the same as fabricating a conventional IGBT.

Although the invention has been described and illustrated with reference to specific embodiments thereof, it is not intended that the invention be limited to these illustrative embodiments. Those skilled in the art will recognized that modifications and variations can be made without departing from the spirit of the invention. Therefore, it is intended that this invention encompass all such variations and modifications as fall within the scope of the appended claims.

I claim:

1. A semiconductor device comprising:
   a substrate of a first conductivity type;
   a first region of a second conductivity type, the second conductivity type being opposite the first conductivity type;
   a voltage sustaining layer of the first conductivity type located between the substrate and the first region;
   a first homogenous embedded region of the second conductivity type located between the substrate and the first region and solely in contact with the voltage sustaining layer of the second conductivity type, the first embedded region being entirely embedded within the voltage sustaining layer and having an approximate geometric center on an imaginary plane spaced apart from the substrate and the first region by an approximate equal distance; and
   a second homogenous embedded region of the second conductivity type located between the substrate and the first region and solely in contact with the voltage sustaining layer of the second conductivity type, the second embedded region being entirely embedded within the voltage sustaining layer and having an approximate geometric center on the imaginary plane and spaced apart from the first embedded region.

2. A semiconductor power device comprising:
   a substrate of a first conductivity type;
   a first region of a second conductivity type;
   a voltage sustaining layer of the first conductivity type located between the substrate and the first region, the voltage sustaining layer having a width, W defined between the first layer and the first region; and
   a first plurality of embedded regions of the second conductivity type located in alignment within the voltage sustaining layer between the substrate and the first region, and a first member of the first plurality of embedded regions having an approximate geometric center on a first imaginary plane parallel to and spaced apart from the substrate by an approximate distance of W/3, and a second member having an approximate geometric center on a second imaginary plane, parallel to and spaced apart from the first region by an approximate distance of W/3.

3. The semiconductor power device according to claim 2 wherein the semiconductor is a diode and the substrate is a cathode and the first region is an anode.

4. The semiconductor according to claim 2 wherein the semiconductor device is a VDMOS and the substrate is a drain and the first region further includes a source region.

5. The semiconductor device according to claim 2 wherein the first member and the second member are between the substrate and the first region.

6. The semiconductor device according to claim 5 further including a third member of the first plurality of embedded regions also spaced apart from the substrate and also spaced apart from the first and second members on said first imaginary planes.

7. The semiconductor power device according to claim 6 wherein the second member has a geometric center offset from a fourth imaginary plane, the fourth imaginary plane defined through the geometric center of the third member and perpendicular to the second imaginary plane.

* * * * *

UNITED STATES PATENT AND TRADEMARK OFFICE
CERTIFICATE OF CORRECTION

PATENT NO. : 7,227,197 B1  
APPLICATION NO. : 10/860435  
DATED : June 5, 2007  
INVENTOR(S) : Xingbi Chen Page 1 of 1

It is certified that error appears in the above-identified patent and that said Letters Patent is hereby corrected as shown below:

Column 5, line 41:

"Second" should be replaced with -- first --.

Signed and Sealed this

Thirteenth Day of May, 2008

JON W. DUDAS  
*Director of the United States Patent and Trademark Office*

UNITED STATES PATENT AND TRADEMARK OFFICE
CERTIFICATE OF CORRECTION

| | | |
|---|---|---|
| PATENT NO. | : 7,227,197 B2 | Page 1 of 1 |
| APPLICATION NO. | : 10/860435 | |
| DATED | : June 5, 2007 | |
| INVENTOR(S) | : Xingbi Chen | |

It is certified that error appears in the above-identified patent and that said Letters Patent is hereby corrected as shown below:

At (60) on the coversheet and in the specification at column 1, lines 9-10.

"application No. 08/263,339, filed on Jun. 21, 1994, now Pat. No. 5,563,350" should be replaced with "application No. 08/268,339, filed on Jun. 30, 1994, now abandoned."

Signed and Sealed this
Thirty-first Day of July, 2012

David J. Kappos
*Director of the United States Patent and Trademark Office*